United States Patent [19]

Narozny

[11] 4,358,172
[45] Nov. 9, 1982

[54] CONNECTOR FOR ELECTRICAL INTERCONNECTION OF CIRCUIT BOARD AND FLAT MULTICONDUCTOR CABLE

[75] Inventor: Ronald S. Narozny, Panorama City, Calif.

[73] Assignee: Thomas & Betts Corporation, Raritan, N.J.

[21] Appl. No.: 143,002

[22] Filed: Apr. 23, 1980

[51] Int. Cl.³ .............................................. H01R 9/07
[52] U.S. Cl. .................................................. 339/17 F
[58] Field of Search ............. 339/17 F, 75 M, 75 MF, 339/176 MF

[56] References Cited

U.S. PATENT DOCUMENTS

| | | | |
|---|---|---|---|
| 3,629,787 | 12/1971 | Wilson | 339/17 F |
| 3,851,294 | 11/1974 | Palazzetti et al. | 339/17 F |
| 4,054,348 | 10/1977 | Stroupe et al. | 339/91 R |
| 4,060,889 | 12/1977 | Zielinski | 29/628 |
| 4,111,510 | 9/1978 | Zurcher | 339/17 F |
| 4,130,327 | 12/1978 | Spaulding | 339/17 CF |
| 4,169,641 | 10/1979 | Olsson | 339/17 F |
| 4,181,386 | 1/1980 | Olsson | 339/17 F |

OTHER PUBLICATIONS

IBM Tech. Disclosure Bulletin, Allen, vol. 14, No. 6, p. 1775, 11/71.

Primary Examiner—Neil Abrams
Attorney, Agent, or Firm—Robert M. Rodrick; Salvatore J. Abbruzzese; Jesse Woldman

[57] ABSTRACT

A connector for effecting releasable contact between individual electrical conductors of a printed circuit board and corresponding overlapping exposed conductors of a flat multiconductor cable comprises an elongate U-shaped resilient member having a pair of longitudinally extending legs. A plurality of cantilevered spring members are spaced longitudinally along one of said legs, projecting transversely therefrom in a direction toward the other leg. Means are provided for releasably affixing the connector to the board such that the spring members are positioned in registry with the overlapping conductors. The spring members are dimensioned with respect to the affixing means such that when the connector is assembled to the board the spring members engage and resiliently press the overlapping exposed cable conductors against the corresponding circuit board conductors thereby establishing electrical connection therebetween. A cantilevered member extending lengthwise on the other leg substantially opposite the spring members is dimensioned with respect to the affixing means so as to press the connected cable against the circuit board thereby providing strain relief therefor.

20 Claims, 6 Drawing Figures

CONNECTOR FOR ELECTRICAL INTERCONNECTION OF CIRCUIT BOARD AND FLAT MULTICONDUCTOR CABLE

BACKGROUND OF THE INVENTION

This invention relates generally to electrical connectors and, more particularly, to connectors for electrically connecting a flat multiconductor flexible cable to a printed circuit board.

The current and expanding use of solid state controls in numerous commercial and industrial applications has placed a great demand on interconnection systems particularly using flexible circuitry and flat multi-conductor cables to carry electrical signals to and from electrical components such as printed circuit boards. A variety of connectors for accommodating flexible circuitry and flat conductor cables is available, the connector construction being often determined by space requirements and size of the components to be inter-connected.

In an effort to provide a miniaturized, inexpensive connector, relatively large insulative housings including contact terminals with plug-and-socket fittings or soldered connections have been replaced with one-piece, formed connectors. Such connectors are shown and described, for example, in U.S. Pat. No. 4,111,510 to Zurcher and U.S. Pat. No. 4,060,889 to Zielinski. These connectors are limited, however, to making an interconnection at the edge of the printed circuit board.

Another known connector is disclosed in U.S. Pat. No. 4,169,641 to Olsson in which a one piece stamped and formed connector accommodates a flat multiconductor cable having one side of the conductors exposed for engagement with electrical conductors on a circuit board. A plurality of cantilever springs extending obliquely from a clip bar individually urge the cable conductors against the circuit board conductors when the clip bar is mounted to the board. The connector is attached to the board by mechanical fastening means such as bendable locking tabs at the ends of the connector that are bent against the underside of the board to rigidly and permanently hold the connector thereon. A similarly mounted connector is shown by Olsson in U.S. Pat. No. 4,181,386 in which a plurality of spring contacts are reversely bent at one edge, each contact having a spring arm portion that extends obliquely underneath the clip bar.

Such connectors, initially mounted rigidly have a tendency due to environmental conditions, such as vibration and temperature changes, to become loose since the fastening means lacks the flexibility to provide compensation for these variations. A loosened clip bar could cause a higher probability of the loss of inter-connection between conductors as there would be a decrease in the contact pressure provided by the spring members. Strain relief capability of a loosened connector, wherein such strain relief is provided by an integral portion of the connector, is also jeopardized.

In addition, removal of the connector to either replace or repair the cable or electrical components necessitates the operational steps of straightening the tabs as well as having access to the undersurface of the printed circuit board. Such bending and straightening of the tabs further weakens the structural integrity of the tabs particularly at the bending portion, resulting in less rigidity in the mounting and a reduction in the useful life of the connector.

SUMMARY OF THE INVENTION:

It is an object of the present invention to provide an improved connector for effecting an electrical connection between an electrical conductor on a substrate and an overlapping electrical conductor.

It is another object to provide a connector for effecting releasable electrical contact between electrical conductors of a printed circuit board and overlapping conductors of a flat multiconductor cable.

According to the present invention, a connector for effecting contact between an electrical conductor on a substrate and on overlapping electrical conductor comprises a resilient member having a pair of spaced leg portions connected to an elongate joining portion. Included is a biasing member that projects transversely outwardly from a surface of one of the leg portions. Means are provided for affixing the leg portions of the resilient member to a surface of the substrate so that the biasing member is positioned adjacently over the overlapping conductors. The biasing member is dimensioned with respect to the affixing means such that upon affixing the member to the substrate the biasing member biases the overlapping conductors into engagement to thereby establish electrical connection therebetween.

In a preferred arrangement, the leg portions are affixed to the same surface as the substrate such that the portion joining the leg portions is in facing relation to the overlapping conductors. Such an arrangement permits mounting of the connector at locations other than the circuit board edge.

In a preferred connector embodiment, a conductor retention member is provided to prevent movement of the overlapping conductor relative to the substrate. The biasing member and the conductor retention member are both cantilevered members in the preferred form, the connector including such members being integrally formed in a one piece structure.

In accordance with a particular preferred embodiment, a connector is provided for effecting releasable contact between the individual electrical conductors of a printed circuit board and corresponding overlapping exposed conductors of a flat multiconductor cable. The resilient member has a plurality of cantilevered spring members that are formed to be positioned adjacently over and in registry with the overlapping conductors and to resiliently press the overlapping conductors into engagement with the circuit board conductors. Releasable affixing means is provided by foot portions at the distal ends of the resilient member, preferably at each lateral extremity of each leg. The foot portions are adapted to extend through apertures provided through the circuit board and to resiliently engage the underside surface thereof.

A cantilevered cable retention member extending lengthwise along the other leg substantially opposite the spring members is preferably included to provide a cable strain relief, such a connector being formed integrally as a one piece structure.

The foregoing and other objects and features of the invention will be evident from the following detailed description of the preferred embodiments of the invention and from the drawings wherein like reference numerals are used to identify like parts throughout.

Figure 1:
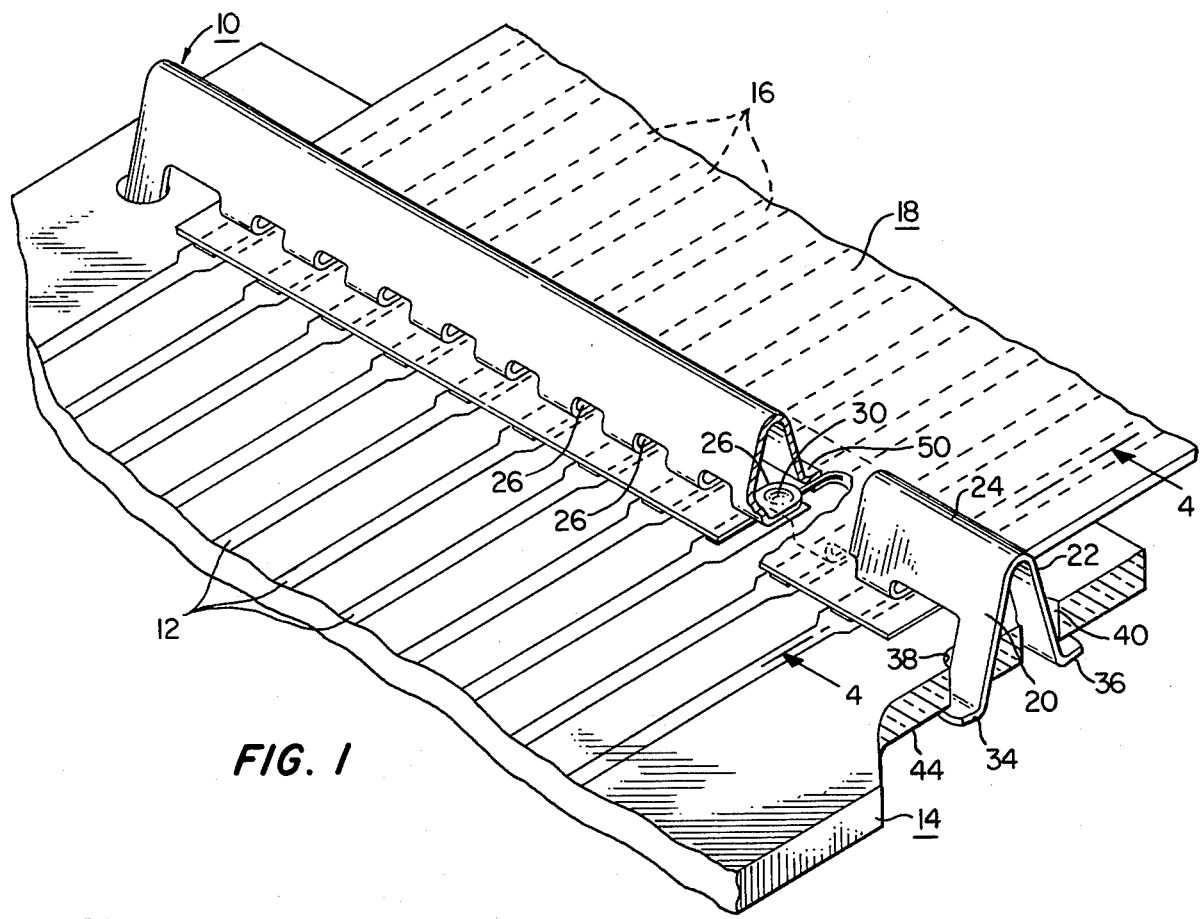
FIG. 1 is a perspective view of a portion of a printed circuit board with a flat multiconductor cable electrically connected thereto by a connector in accordance with a preferred embodiment of the invention, the connector and cable being partly broken away to show structural details of the connector.

DETAILED DESCRIPTION OF THE PREFERRED EMBODIMENTS:

Referring to the drawings, there is shown in FIG. 1 an electrical connector 10 for effecting an electrical interconnection between the electrical conductors 12 on an insulative circuit board 14 and the corresponding overlapping electrical conductors 16 of a flat multiconductor flexible cable 18. The conductors 12 on the board 14 may be formed by any known printing or other circuit forming techniques. The flexible cable 18 is of conventional structure, comprising a plurality of spaced conductors 16 surrounded by insulation, such as polyester or other suitable plastic.

Figure 3:
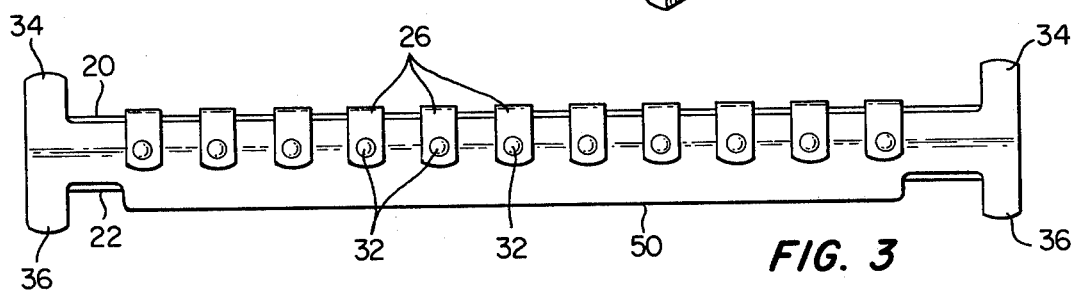
FIG. 3 is a bottom view of the connector of FIG. 1.
Figures 2, 5, 6:
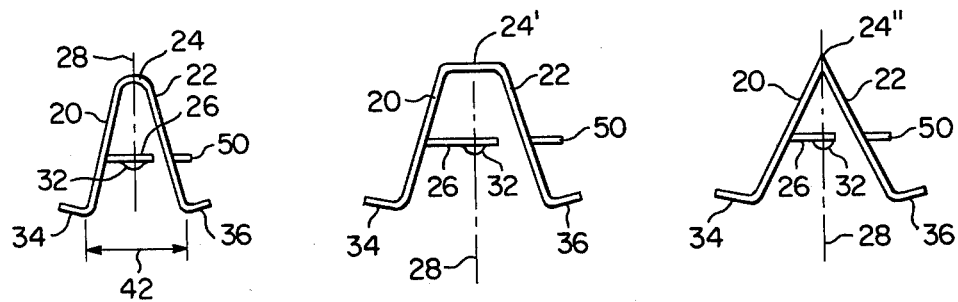
FIG. 2 is a side elevational view of the connector shown in FIG. 1.
FIGS. 5 and 6 are side elevational views of various other connector configurations.

The connector 10, as shown in FIGS. 1-3, is an elongate member of resilient material having good spring properties, the connector 10 including a pair of spaced legs 20 and 22 connected to and diverging from a central joining portion 24. In the preferred embodiment illustrated, the joining portion 24 is curved for ease of manufacture, the legs 20, 22 and curved joining portion defining a structure having a substantially U-shaped cross-section. Other connector cross-sections may also be utilized in the practice of the invention such as those shown, for examle, in FIGS. 5 and 6. In FIG. 5, the joining portion 24' is substantially flat and in FIG. 6, the joining portion 24" is relatively sharp, the cross-section being substantially V-shaped.

Referring back to FIGS. 1-3, the connector 10 includes a plurality of cantilevered spring members 26 spaced apart from each other longitudinally along the connector 10 and projecting transversely from the leg 20 in a direction toward the other leg 22. The spring members 26 are formed to be spaced apart approximately the same distance as the circuit board conductors 12 and cable conductors 16 so that when the connector is affixed to the board 14, as will be described, the spring members 26 are positioned adjacently over and in substantial registry with the overlapping conductors.

In the preferred form, the spring members are formed to extend from leg 20 toward leg 22 through a plane 28 longitudinally bisecting the connector 10. An indentation 30 is formed in the upper surface of each spring member 26 to thereby provide a portion 32 that protrudes downward from the lower surface of each spring member 26. The indentation 30 is preferably formed in such spring members 26 so that the lowest point on the protruding portion 32, i.e., the point farthest from the lower surface of the spring member, is substantially within the bisecting plane 28. The protruding portion 32 is provided in the preferred embodiment to contact the overlapping cable 18, as will be described. As such, it is desirable that the point of contact be substantially centrally located between the legs 20 and 22 so as to equalize the contact forces exerted thereby while minimizing undesirable twisting of the connector 10 due to torquing.

The connector 10 is releasably affixed to the board 14 by foot portions 34 and 36 that are connected respectively at the distal ends of legs 20 and 22. In the preferred embodiment of the connector 10 depicted in FIGS. 1-3, the foot portions 34, 36 are provided at the lateral extremities of each leg 20, 22, it being understood that foot portions may be provided at various locations longitudinally along the legs 20, 22 depending upon the interconnection requirements and the cable and printed circuit pattern. As shown, the foot portions 34, 36 extend from the leg edges a portion of the longitudinal extent of the legs 20, 22.

The foot portions are formed to extend below the surface of the spring members 26 and are adapted to extend through apertures 38 and 40 formed through the circuit board 14 and having diameters sufficiently large to accommodate the foot portions 34, 36 at each lateral extremity thereof. The apertures 38, 40 are formed such that when the foot portions are inserted therethrough to thereby affix the connector 10 to the board 14, the connector extends transversely across the overlapping conductors with the spring members 26 being aligned in registry therewith.

The apertures 38 and 40 are spaced apart transversely with respect to the longitudinal axis of the connector 10 so that the distance between the farthest walls of the apertures 38 and 40 is less than the distance between the base of the leg portions 20, 22, as indicated by arrow 42 in FIG. 2, while the connector is in its free unstressed condition. The foot portions 34, 36, extending outwardly from the legs 20 and 24, respectively, are formed to fit through the apertures 38 and 40 upon squeezing the legs 20, 22 toward each other. Upon extending therethrough, the foot portions 34, 36 resiliently engage the underside surface 44 (FIG. 1) of the circuit board 14 with the base on each leg 20, 22 contacting the farthest walls of the apertures 38 and 40 so as to stress the connector 10 thereby maintaining the connector 10 resiliently affixed to the board 14. It should be appreciated that although a pair of apertures 38 and 40 are utilized in the mounting of the connector 10 to the board 14, other openings or single slots suitably formed therethrough may also be used.

Figure 4:
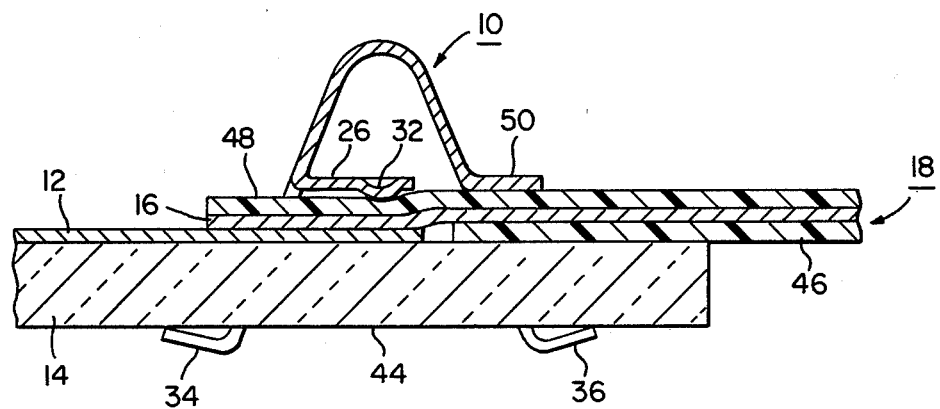
FIG. 4 is an enlarged cross-sectional view of the connector and interconnection of the overlapping cable conductors to the conductors on the circuit board as seen along viewing lines 4—4 of FIG. 1.

The dimensions of the connector 10 are related to the dimensions of the board 14, conductors 12 thereon and the cable 18. As shown in FIG. 4, a portion of the insulation 46 is stripped back a predeterined longitudinal extent along the lower surface of the cable 18 to expose the undersurface of the conductors 16 thereof. The exposed conductors 16 are arranged to make contact with the conductors 12 on the board 14. Thus, the distance between the foot portions 34 engaging the underside surface 44 and the lowest point of the protruding portion 32 on each spring member is less than the combined thicknesses of the circuit board 14, conductor 12 thereon, the cable conductor 16 and the unstripped upper insulation layer 48.

In a preferred form of the present connector 10, a strain relief is provided to prevent or minimize relative movement of the cable 18 with respect to the circuit board 14 during electrical interconnection of the cable 18 with the conductors 12 on the board 14. Such a strain relief preferably comprises a cantilevered member 50 formed to extend lengthwise on leg 22, projecting outwardly from the leg 22 substantially opposite the spring members 26. For ease of manufacture, the lower surfaces of the spring members 26 (prior to indenting) and the strain relief member 50 are formed substantially on the same plane.

As illustrated in FIG. 4, the cable 18 is arranged to lie in relation to the connector position such that an unstripped cable portion lies beneath the strain relief 50 and the circuit board 14. Thus, as shown, the distance between the foot portions 36 engaging the underside surface 44 and the lowest surface of the strain relief member 50 is at least less than the combined thicknesses of the board 14 and the cable 18 including upper and lower insulation layers 46, 48 and the conductor 16. Although not shown, the conductor 12 may extend on the board 14 beneath the strain relief member 50 with the added thickness of the conductor 12 enhancing the holding effect of the strain relief member 50.

In use, the cable 18 with exposed conductors 16 is positioned on the circuit board 14 with the exposed conductors 16 overlapping corresponding conductors 12. The stripped portion of the cable 18 is positioned to lie at least beneath the protruding portion 32 while the unstripped portion is preferably positioned to be beneath the strain relief member 50. The connector 10 is affixed to the board 14 by squeezing the legs 20 and 22 toward each other (with suitable tooling) and then inserting the foot portions 34, 36 through the apertures 38, 40. The legs 20 and 22 are then released so that the foot portions 34, 36 resiliently engage the underside surface 44. Releasing the connector may be effected by again resiliently squeezing the legs 20, 22 toward each and then withdrawing the connector from the apertures 38 and 40.

When the connector 10 is in the assembled position, affixed to the board 14, the protruding portions 32 on the spring members 26 will engage the upper insulation 48 due to the distance to the foot portion 34 hereinbefore described. As a result, the individual spring members 26 will flex upwardly, biasing the overlapping exposed cable conductors 16 into engagement with the conductor 12, establishing thereby electrical connection therebetween. Similarly the strain relief member 50 will engage the upper insulation 48 of the cable due to the distance to the foot portion 36 and will flex upwardly, resiliently pressing the cable 18 against the board 14 to prevent relative movement therebetween.

As described herein, the connector 10 of the present invention is a one piece structure preferably integrally formed as by stamping and forming or other suitable techniques. The connector may be made of any suitable resilient material, metallic or non-metallic. For example, a metallic connector may be formed of 1095 hardened steel on the order otf 0.010 inch (0.254 mm.) thick. As the connector 10 is not part of the electrical circuit, the connector may be coated with an insulating material, if desired, such as a high dielectric plastic film, to void or minimize short circuiting the conductors.

Although the connector has been described herein in the preferred embodiment as providing an electrical interconnection between a plurality of exposed cable conductors and a corresponding plurality of electrical conductors on a printed circuit board, it should be appreciated that the connector may make other various connections within the contemplated scope of the invention. For example, the connector may be utilized to provide an electrical connection between an electrical conductor on a substrate and overlapping electrical conductor, the substrate providing the support for the connection of the conductors to each other.

Also while the connector configurations described herein are preferred, other configurations, although perhaps less desirble, are within the contemplated scope of the invention. For example, the spring members 26 may be arranged to project outwardly from leg 20 in a direction away from instead of toward leg 22. The contact point provided by protruding portion 32 would not be centrally located as desired but would provide a biasing means for pressing overlapping conductors into engagement as described herein.

It should now be appreciated that the connector of the present invention as disclosed herein overcomes the disadvantages of the prior art. Variations in thickness of flat cable or flexible circuitry as well as variations due to environmental conditions are compensated by the resilient mounting of the connector to the board. The resilient mounting further facilitates releasable interconnection between the conductors without need for access to the undersurface of the board or by permanent bending of any portions of the connector in mounting or removal thereof. Furthermore, the present connector may be affixed to any location on a board, not only at the edges.

While the invention has been disclosed by way of particularly preferred embodiments, various modifications will now be evident to those skilled in the art. Accordingly, the preferred embodiments are intended in an illustrative and not a limiting sense. The true spirit and scope of the invention are set forth in the following claims.

What is claimed is:

1. A connector for effecting releasable contact between the individual electrical conductors of a printed circuit board and corresponding overlapping exposed conductors of a flat multiconductor cable, comprising:

an elongate member of resilient material having a pair of legs connected to and extending longitudinally with a joining portion;

means for releasably affixing said member to said printed circuit board transversely across said overlapping conductors, said affixing means comprising a foot portion at the distal end of each leg, said foot portions adapted to extend through apertures provided through said printed circuit board and to resiliently engage the underside surface of said board;

a plurality of cantilevered spring members spaced longitudinally along said connector and projecting transversely from one of said legs, said spring members being formed to be positioned adjacently over and in registry with the respective overlapping conductors upon affixing said member to said printed circuit board;

said spring members being dimensioned with respect to said foot portions such that when said foot portions are in the engagement position said spring members engage and resiliently press the respective overlapping exposed cable conductors against the corresponding conductors of the printed circuit board thereby establishing electrical connection therebetween; and a cantilevered cable retention member extending lengthwise along and projecting transversely from the other leg of said elongate member, said retention member being dimensioned with respect to the foot portions such that when said foot portions are in the engagement position said retention member engages and presses said cable against said printed circuit board to thereby prevent relative movement therebetween.

2. A connector according to claim 1, wherein said spring members each comprise a cable contact portion protruding beneath the lower surface of each spring member in facing relation to said cable, said contact portions engaging the cable when the resilient member is affixed to the printed circuit board.

3. A connector according to claim 2, wherein the protruding contact portion of each cantilevered spring member is substantially centrally located between said legs.

4. A connector according to claim 3, wherein said elongate member has a cross section defining a substantially U-shaped structure and wherein the lowest point of each of said contact portions lies substantially in a plane longitudinally bisecting said U-shaped member.

5. A connector according to claim 4, wherein insulation is stripped back a predetermined longitudinal extent along said cable to expose the undersurface of said conductors thereof, the contact portions of said spring members engaging the insulated side of said cable, the cable being positioned in overlapping relation on said printed circuit board such that said retention member engages the cable at a point whereat said insulation is unstripped.

6. A connector according to claim 5, wherein the distance between the foot portions engaging the underside surface of said printed circuit board and the protruding contact portion of each spring member engaging said cable is less than the combined thicknesses of said printed circuit board and an electrical conductor thereon and the exposed electrical conductor and unstripped insulation of said cable.

7. A connector according to claim 5, wherein the distance between said foot portions engaging the underside surface of said printed circuit board and said retention member engaging said cable is less than the combined thicknesses of the printed circuit board and the unstripped multiconductor cable including a central conductor surrounded with insulation.

8. A connector according to claim 1, wherein said foot portions are provided at the lateral extremities of each leg, said foot portions projecting outwardly from each leg surface and extending a portion of the longitudinal extent of said legs.

9. A connector according to claim 1 in which said connector is an integrally formed structure.

10. A connector according to claim 1, wherein the distance between legs at the foot portions thereof transverse the longitudinal axis of said elongate member in its free unstressed condition is less than the distance between farthest spaced walls of the apertures provided through said circuit board for receiving said foot portions.

11. An integrally formed electrical connector, comprising:
an elongate member of resilient material having a pair of longitudinally extending leg portions connected to and diverging from a central joining portion, such that said leg portion and said central portion define a structure having a substantially U-shaped cross-section;
a foot portion at the distal end of each leg portion, said foot portions extending outwardly from the surface of said leg portions and extending a portion of the longitudinal extent of said leg portions;
a plurality of cantilevered spring members spaced lengthwise along one of said leg portions between said foot portion and said joining portion, each spring member extending transversely from said one leg portion inwardly in a direction toward said other leg portion; and
a cantilevered member extending lengthwise along and outwardly from the other leg portion, substantially opposite said spring members, and being disposed a predetermined relative distance from said foot portions forming thereby a support space therebetween.

12. A connector according to claim 11, wherein each of said spring members is provided with a surface portion that protrudes from a surface of each spring member in a direction away from said central joining portion.

13. A connector according to claim 12, wherein each spring member extends beyond a plane longitudinally bisecting said U-shaped member and wherein the point on said protruding portion most distant from the surface of the spring member lies substantially in said bisecting plane.

14. A connector according to claim 11, wherein foot portions are provided at the lateral ends of each leg.

15. A combination including:
(a) an electrical conductor;
(b) a substrate having an electrical contact thereon; and
(c) a connector for effecting contact between said electrical conductor and said electrical contact, said connector including:
(1) a resilient member having a pair of spaced leg portions connected to an elongate joining portion, said leg portions being affixed to said substrate whereby said joining portion is positioned in facing relation to said conductor disposed in overlapping position on said contact of said substrate;
(2) a cantilevered biasing member projecting transversely outwardly of said resilient member from a surface of one of said leg portions in a direction toward said other leg portion;
(3) a foot portion at the distal end of each leg portion, said foot portion adapted to extend through openings provided through said substrate and said foot portions resiliently engaging the underside surface of said substrate so that said biasing member is positioned adjacently over said overlapping conductor; and
(4) a conductor contact portion on said cantilevered biasing member, said contact portion protruding beneath the lower surface of said cantilevered biasing member in facing relation to said overlapping conductor, said cantilevered biasing member and said contact portion being dimensioned with respect to said foot portions such that said contact portion securely and fixedly engages said overlapping conductor establishing thereby electrical contact between said contact of said substrate and said conductor.

16. The combination according to claim 15, wherein the distance between said foot portions engaging the underside surface of said substrate and the protruding contact portion engaging said overlapping conductors is less than the combined thicknesses of said substrate, said electrical conductor on said substrate and the overlapping electrical conductor.

17. The combination according to claim 16, wherein said joining portion is curved and said leg portions diverge from said curved joining portion to define a substantially U-shaped member.

18. The combination according to claim 17, wherein said cantilevered member extends toward said other leg portion through a plane longitudinally bisecting said U-shaped member and wherein the lowest point on said protruding contact portion lies substantially within said bisecting plane.

19. The combination according to claim 18, further including conductor retention means on said other leg portion, said conductor retention means being dimensioned with respect to said affixing means for engaging and pressing said overlapping conductor against said substrate to thereby prevent relative movement therebetween.

20. The combination according to claim 19, wherein said conductor retention means comprises a cantilevered member extending outwardly from a longitudinal surface of said other leg portion, and wherein said leg portions, said joining portion, said feet portions, said cantilevered biasing member and said cantilevered retention member are integrally formed.

* * * * *